United States Patent [19]
Keil et al.

[11] Patent Number: 5,773,518
[45] Date of Patent: Jun. 30, 1998

[54] ESTERIFIED STYRENE/MALEIC ANHYDRIDE POLYMER

[75] Inventors: Charles R. Keil, Foothill Ranch; Randall William Kautz, Irvine, both of Calif.

[73] Assignee: Morton International, Inc., Chicago, Ill.

[21] Appl. No.: 911,890

[22] Filed: Aug. 15, 1997

Related U.S. Application Data

[62] Division of Ser. No. 711,297, Sep. 6, 1996, Pat. No. 5,698,370, which is a continuation of Ser. No. 386,974, Feb. 10, 1995, Pat. No. 5,576,145.

[51] Int. Cl.$^6$ ..................................................... C08F 8/14
[52] U.S. Cl. ........................................ 525/327.7; 525/384
[58] Field of Search .......................................... 525/327.7

[56] References Cited

U.S. PATENT DOCUMENTS

| | | | |
|---|---|---|---|
| 2,537,017 | 1/1951 | Barrett | 260/45.2 |
| 2,537,018 | 1/1951 | Barrett | 260/17 |
| 2,537,019 | 1/1951 | Barrett | 260/45.2 |
| 2,537,020 | 1/1951 | Barrett | 260/78.5 |
| 3,917,573 | 11/1975 | Parekh et al. | 525/327.7 |
| 3,953,309 | 4/1976 | Gilano et al. | 204/159.16 |
| 3,954,725 | 5/1976 | Gross | 525/327.7 |
| 4,008,087 | 2/1977 | Aono et al. | 96/69 |
| 4,192,930 | 3/1980 | Beck et al. | 525/327.7 |
| 4,273,857 | 6/1981 | Leberzammer et al. | 430/281 |
| 4,293,635 | 10/1981 | Flint et al. | 430/271 |
| 4,722,947 | 2/1988 | Thanawalla et al. | 522/120 |
| 4,734,204 | 3/1988 | Lamb | 525/327.7 |
| 4,745,138 | 5/1988 | Thanawalla et al. | 522/120 |
| 4,987,054 | 1/1991 | Sondergeld et al. | 430/275 |
| 5,158,996 | 10/1992 | Velenti | 525/327.7 |
| 5,296,334 | 3/1994 | Castaldi et al. | 430/280 |
| 5,516,853 | 5/1996 | Schneider et al. | 525/327.7 |

OTHER PUBLICATIONS

*Journal of Applied Polymer Science* vol. 16, pp. 449–460 (1972) Esterfication of Styrene—Maleic Anhydride Copolymer by Mixed Alcohols (J. Aoyagi & I Shinohara).

*Journal of Polymer Science: Part A: Polymer Chemistry*, vol. 31, 691–700 (1993) ©1993 John Wiley & Sons, Inc.: Monoesterification of Styrene—Maleic Anhydride Copolymers with Alcohols in Ethyl Benzene: Catalysis and Kinetics.

Chemical Abstracts 53:9731d; 59:P2970b; 29:155ole; 60:14618C; 62:2840a; 53:18540a; 55:P8946C; 46:731a; 47:1379b; 47:1379g; 73:P26243p; 73:89867r; 74:P13799v; 75:P64632P; and 74:113371t.

*Primary Examiner*—Bernard Lipman
*Attorney, Agent, or Firm*—Wayne E. Nacker; Gerald K. White

[57] ABSTRACT

A binder polymer is a styrene/maleic anhydride copolymer in which the maleic anhydride residues are mono-esterified to between about 50 and about 65 mole percent of an alkyl, aryl, cycloalkyl, alkaryl, or arylalkyl alcohol having a molecular weight greater than 100, to between about 15 and about 50 mole percent of a $C_1$–$C_3$-alkyl alcohol, and to at least about 80 mole percent total. The polymer has between about 45 and about 65 mole percent styrene residues and between about 35 and about 55 mole percent maleic anhydride residues, a weight average molecular weight of between about 80,000 and about 200,000, and an acid number of between about 170 and about 220.

8 Claims, No Drawings

ESTERIFIED STYRENE/MALEIC ANHYDRIDE POLYMER

This is a divisional of application Ser. No. 08/711,297, filed Sep. 6, 1996, now U.S. Pat. No. 5,698,370, which is a continuation of U.S. Ser. No. 08/386,974, filed on Feb. 10, 1995, now U.S. Pat. No. 5,576,145.

The present invention is directed to photoimageable compositions, such as photoresists useful in forming printed circuit boards, and particularly to such compositions which, subsequent to exposure to actinic radiation and development in alkaline aqueous solution, are subject to further processing with highly alkaline aqueous solutions.

BACKGROUND OF THE INVENTION

Photoimageable compositions useful, for example, as photoresists for forming printed circuit boards are taught in U.S. Pat. No. 3,953,309 to Gilano et al., the teachings of which are incorporated herein by reference. The major components of the composition are a photopolymerizeable material, e.g., an $\alpha$, $\beta$-ethylenically unsaturated monomer or short chain oligomer, a photoinitiator chemical system, and an acid functional binder, such as a copolymer of styrene and monobutyl maleate. The photoimageable composition taught in U.S. Pat. No. 3,953,309 also has a free radical inhibitor to prevent premature thermal-initiated polymerization.

The photoimageable compositions taught in U.S. Pat. No. 3,953,309 are developable in alkaline aqueous solution, such as dilute sodium carbonate solution, as a result of significant carboxylic acid functionality of the binder polymer. For example, in a styrene/monobutyl maleate polymer, each monobutyl maleate residue provides one non-esterified carboxylic moiety. A layer of photoimageable composition, subsequent to patterned exposure to actinic radiation and development in alkaline aqueous solution to remove non-exposed portions of the layer, are exposed to an acid etch solution, such as ferric chloride, to etch underlying copper from a circuit board blank.

Photoimageable compositions using as binder polymers of styrene and monoesters of maleic anhydride are also taught in U.S. Pat. Nos. 4,273,857 and 4,293,635, the teachings of each of which are incorporated herein by reference. Binders which are copolymers of styrene and monoesters of maleic anhydride are commercially available, e.g., Scripsets resins sold by Monsanto Chemical Co.

While the post-development processing in U.S. Pat. No. 3,953,309 is in an acidic solution, other post development processing is conducted in highly alkaline solutions, such as ammoniacal etchants or metal plating solutions. The acid functionality of the polymers in the patents referenced above, while rendering them developable in alkaline aqueous solutions, also renders even the exposed, photopolymerized portions of the resist layer subject to degradation in highly alkaline aqueous solutions. In highly alkaline environments, such resists would be subject to delamination and stripping.

U.S. Pat. No. 4,987,054 describes the use of an amine-modified methyl methacrylate/styrene/maleic anhydride "copolymer" which can be thermally cured after exposure and development. This thermal cure produces a film which has excellent resistance to alkaline processing environments. However, the additional post-development thermal curing step can be impractical in high volume printed circuit board production.

U.S. Pat. No. 4,008,087 describes styrene/maleic anhydride copolymers esterified with phenethanol. The polymers are used in silver halide photoemulsions.

U.S. Pat. No. 4,722,947 describes radiation curable polymers which are styrene/maleic anhydride copolymers that are esterified with a hydroxyalkyl acrylyl compound and optionally with another alcohol, such as an arylalkyl monohydric alcohol. The compositions containing the esterified polymer are useful in radiation cured compositions, such as coatings, adhesives and films.

U.S. Pat. No. 4,273,857 describes photoimageable compositions containing styrene/maleic anhydride copolymers partially esterified with methanol and isopropanol.

SUMMARY OF THE INVENTION

A binder polymer is a styrene/maleic anhydride copolymer in which the maleic anhydride residues are mono-esterified to between about 50 and about 65 mole percent of an alkyl, aryl, cycloalkyl, alkaryl, or arylalkyl alcohol having a molecular weight greater than 100, to between about 15 and about 50 mole percent of a $C_1$–$C_3$-alkyl alcohol, and to at least about 80 mole percent total. The polymer has between about 45 and about 65 mole percent, preferably between about 50 and about 55 mole percent styrene residues and between about 35 and about 55 mole percent, preferably between about 45 and about 50 mole percent maleic anhydride residues, a weight average molecular weight of between about 80,000 and about 200,000 and an acid number of between about 170 and about 220.

DETAILED DESCRIPTION OF CERTAIN PREFERRED EMBODIMENTS

The currently preferred method of forming the polymer of the present invention is to initially copolymerize styrene and maleic anhydride by a free-radical polymerization procedure. Styrene and maleic anhydride are known to polymerize in a regular alternating pattern which provides an ordered backbone polymer. Accordingly, the mole ratio of styrene and maleic anhydride is approximately 1:1, i.e., between about 45 and about 65 mole percent styrene and between about 35 and about 55 mole percent maleic anhydride.

While styrene is the preferred comonomer used for forming the binder polymer, styrene substituted with a $C_1$–$C_6$ alkyl, either $\alpha$-substituted, e.g., $\alpha$-methyl styrene, or substituted on the aromatic ring, e.g., vinyl toluene, may also be used, as may mixtures of such styrene and/or substituted styrene.

While maleic anhydride is the preferred comonomer, $C_1$–$C_3$-mono or di-alkyl-substituted and aryl-substituted maleic anhydrides may also be used, such as 2-methyl maleic anhydride, 2-ethyl maleic anhydride, 2-phenyl maleic anhydride and 2,3-dimethyl maleic anhydride.

Subsequently, the styrene/maleic anhydride is esterified with what will be referred to herein as a "major alcohol", which is an alkyl, aryl, cycloalkyl, arylalkyl or alkylaryl monoalcohol having a molecular weight greater than 100. Also, a mixture of such alcohols is suitable. Preferably, the major alcohol used has an aromatic moiety or a cycloaliphatic moiety. Some examples of suitable major alcohols are 3-cyclohexyl-1-propanol, cyclohexylmethanol, phenylethyl alcohol, methyl cyclohexanol and 2-ethyl-1-hexanol. From a performance standpoint, 3-cyclohexyl-1-propanol and cyclohexylmethanol are currently preferred. However, phenethyl alcohol also provides excellent performance and, from a cost standpoint, is currently preferred. The major alcohol is provided so as to esterify between about 50 and about 65 mole percent of the maleic anhydride residues of the polymer. Typically, the esterification reaction does not go to fully to completion; thus, a slight excess of the major alcohol is reacted, i.e., between about a 1 and about 5 mole % excess over the desired degree of esterification. The relatively large hydrophobic groups of the major alcohol is believed primarily responsible for giving the photoimageable composition containing the polymer its resistance to highly alkaline solutions. The molecular weight of the major alcohol is typically not above about 250 and usually not above about 200.

It is found to be necessary that the binder polymer be esterified to as high a degree as possible, i.e., preferably to at least about 80 mole percent of the maleic anhydride residues. Such a high degree of esterification usually cannot be readily achieved using the major alcohol alone. Accordingly, the partially esterified polymer is further esterified with the $C_1$–$C_3$-alkyl "minor alcohol". Thus suitable minor alcohols are methanol, ethanol, and n-propanol. Isopropanol is found not to work particularly well. Methanol is the preferred minor alcohol. The minor alcohol, probably because of the small size of the molecule, achieves the degree of total esterification not achievable using the major alcohol alone. The additional esterification provided by the minor alcohol boosts the acid number by creating the non-esterified carboxylic moiety of the half-ester maleic anhydride residue. Again, a slight excess of the minor alcohol, e.g., between about 1 and about 5 mole percent excess, is used.

In both esterification processes, a half-ester of each maleic anhydride moiety is achieved, the second carboxylic acid functional group being more difficult to esterify. Thus, the esterification reaction also produces the acid functionality which renders the polymer developable in alkaline aqueous solution. Although 100% of the maleic anhydride moieties may be acceptably esterified, typically, a small percentage, e.g., 20 or less, mole percent of the maleic anhydride moieties, remain non-esterified.

To produce the image, this negative-acting photoimageable composition contains B) photopolymerizeable multifunctional monomers or low molecular weight oligomers, particularly α,β-ethylenically unsaturated monomers or oligomers. Some particularly suitable multifunctional acrylic monomers, are tetraethylene glycol diacrylate (TEGDA), trimethylol propane triacrylate (TMPTA), butanediol dimethacrylate (BDDMA) and pentaerythritol triacrylate (PETA). Additional multifunctional monomers include 1,5-pentanediol diacrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate. Multi-acrylate functional oligomers, such as polyester, urethane, epoxy, and acrylic oligmers that are functionalized with acrylate or methacrylate moieties, are also useful in this invention. Such oligomers should have molecular weights below about 3000 preferably below about 2000.

To initiate polymerization of the monomers and/or oligomers upon exposure to actinic radiation, the photoimageable composition contains C) an appropriate photoinitiator(s) or photoinitiator chemical system. Suitable photoinitiators include benzoin ethers, benzil ketals, acetophenones, benzophenones and related compounds with amines.

The composition generally contains additional minor components as is know in the art. For example, the composition generally contains a free-radical inhibitor to prevent premature thermal polymerization of the monomer or oligomer B). Other conventional additives include dyes, flow control modifiers, anti-foaming agents, pigments, antioxidants, etc.

The components of the composition are dissolved in a suitable solvent, such as acetone or methyl ethyl ketone (MEK). Typically, the solids level of the composition is between about 20 and about 60%; however, this may vary depending on application.

While the immediate application of the photoimageable composition of the present invention is in primary resists, it is considered within the scope of the present invention to include a post-development thermal-curing chemical system which renders the photoimageable composition hard and permanent. Such thermal cured systems render the composition suitable as a mask, such as a solder mask. Typically, the thermal-curing chemical system is an epoxy resin plus a curative and/or cure catalyst for the epoxy resin. Examples of photoimageable compositions containing epoxy-based thermal-curing chemical systems are found in U.S. Pat. Nos. 5,229,252 and 5,364,736, the teachings of each of which are incorporated herein by reference.

The composition may be directly applied to a blank used to form a printed circuit board, or, in the case of a solder mask-forming composition, to a printed circuit board and then drying the composition to remove solvent. Alternatively, the composition may be used to form a dry film by applying the composition to a support sheet, such as a polyethylene terephthalate sheet, drying the composition, and thereafter applying a protective sheet, such as polyethylene. The composition, whether directly applied, or transferred from a dry film, is processed in a conventional manner. The composition is exposed through artwork to patterned actinic radiation and then developed in an alkaline aqueous solution, such as 1% sodium carbonate solution. After development, the photopolymerized portions remaining may be further processed, including in highly alkaline aqueous solution.

While a major advantage of photoimageable compositions using the polymer of the present invention is resistance to highly alkaline solutions, other unexpected advantages are achieved as well. The compositions exhibit improved resistance to "cold flow" and "edge fusion" even with very high levels, i.e., greater than 2%, of residual solvent in the dried film. This is unexpected because conventional styrene/maleate polymers, such as Scripset® resins, or acrylate ester polymers, exhibit edge fusion at this solvent retention level in a relatively short time period.

The resistance of the exposed and developed composition to alkaline environment, includes localized alkaline environment, such as is developed in gold plating processes. U.S. Pat. No. 4,987,054, for example, equates an alkaline etching process to a gold electroplating process. The acid content (pH) of the gold plating solution may be acidic or neutral; however, as the gold is electroplated onto a copper surface, electrodeposition by-products, such as hydroxide and cyanide ions, accumulate near the copper-resist interface, resulting in a localized alkaline concentration being temporarily developed, this localized alkaline concentration may attack the photoresist and may cause delamination of the photoresist to occur.

The compositions provide improved film flexibility which is of particular importance in tenting through-holes on printed circuit boards. This is particularly surprising because polymers containing high levels of styrene, i.e., greater than 30%, usually form films which are extremely brittle and easily damaged.

Additional unexpected advantages include reduced adhesion to artwork materials used for pattern imaging and elimination of polymerization inhibition by oxygen.

The invention will now be described in greater detail by way of specific examples.

EXAMPLE 1

A monomer mixture was prepared by combining 178.3 grams of maleic anhydride, 215.6 grams of styrene, 117.5 grams of methyl ethyl ketone (MEK) and 3.3 grams of benzoyl peroxide. 470 grams of MEK was heated to 75°–80° C. in a flask equipped with a mechanical agitator and a condenser. The monomer mixture was added to the hot MEK over a 6 hour period while maintaining the flask contents at 75°–80° C. The reaction mixture was heated at 75°–80° C. for an additional 12 hours; during which through the first 8 hours, 0.66 grams of benzoyl peroxide were added every 2 hours.

148.1 grams of phenethanol plus 11.1 grams of 4-(N,N-dimethylamino)-pyridine were added to the Styrene/maleic anhydride polymer solution and the combined mixture was maintained at 75°–80° C. for 14 hours. At the end of that time, 265 grams of MEK and 22.5 grams of methanol were added. The mixture was then maintained at 75°–80° C. for 6 hours. The esterified polymer solution was then cooled and bottled.

The polymer was determined to have a weight average molecular weight of 167,000 and an acid number of 185. 52 mole percent of the polymer backbone were styrene residues; 48 mole percent maleic anhydride residues. 56 mole percent of the maleic anhydride residues were half-esterified with phenethanol, 36 mole percent were half-esterified with methanol; and 8 mole percent were non-esterified.

EXAMPLE 2

A polymer was prepared as per Example 1 except that 138.4 grams of cyclohexylmethanol were used instead of the phenethanol.

The polymer was determined to have a weight average molecular weight of 124,000 and an acid number of 193. 51 mole percent of the polymer backbone were styrene residues; 49 mole percent maleic anhydride residues. 53 mole percent of the maleic anhydride residues were half-esterified with cyclohexylmethanol, 33 mole percent were half-esterified with methanol; and 14 mole percent were non-esterified.

EXAMPLES 3–5

| Component | Wt. % |
|---|---|
| Example 3 | |
| Polymer (Example 1) | 64.4 |
| Trimethylolpropane triacrylate | 20.6 |
| Tetraethylene glycol diacrylate | 10.3 |
| Benzophenone | 3.62 |
| Michler's ketone | 0.50 |
| Adhesion Promotors | 0.17 |
| Dye Materials | 0.134 |
| Antioxidants | 0.11 |
| Flow Promoters | 0.17 |

EXAMPLE 4

| Example 4 | |
|---|---|
| Polymer (Example 1) | 60.8 |
| Trimethylolpropane triacrylate | 19.8 |
| Polyethylene glycol diacrylate | 10.7 |
| Ethyl Michler's ketone | 0.3 |
| 2-ethylhexyl p-(N,N-dimethylamino) benzoate | 3.0 |
| Benzbphenone | 4.6 |
| Thiodiethylene bis-(3,5-di-tert-butyl-4-hydroxy hydrocinnamate) (antioxidant) | 0.4 |
| Adhesion Promotors | 0.15 |
| Dye Materials | 0.05 |
| Flow Promoters | 0.20 |

EXAMPLE 5

| Example 5 | |
|---|---|
| Polymer (Example 2) | 52.9 |
| Acid functional oligomer (MW, 2000; acid no. 174)* | 8.33 |
| Ethoxylated neopentyl glycol diacrylate | 10.6 |
| Ethoxylated trimethylolpropane triacrylate | 15.9 |
| Isopropyl thioxanthone | 1.7 |
| 2-methyl-1-[4-(methylthio)phenyl]-2-morpholino propane-1-one | 6.0 |
| 1-hydroxy cyclohexyl phenyl ketone | 2.0 |
| Thiodiethylene bis-3,5,-di-tert-butyl-4-hydroxy hydrocinnamate | 0.33 |
| Adhesion Promotors | 0.43 |
| Dye Materials | 1.32 |
| Antioxidant | 0.70 |
| Flow Promoters | 0.26 |

*RSX-89395 available from UCB-Radicure

EXAMPLE 6

Each of the photoimageable compositions of Examples 3–5 was applied to a polyester support sheet and dried. Then a polyethylene protective sheet was applied. A thin film of 1.3 to 1.5 mil thickness was obtained. The polyethylene sheet was removed and the dried film with support sheet was laminated to a copper-clad board using a hot roll laminator. The roll temperature was 122° C.; the roll speed was one meter per minute; and the roll pressure was 2.8 bars. The photoimageable composition was exposed through artwork. The photoimageable composition was developed in 1% sodium carbonate monohydrate at 29.4° C. and the board was etched in an AC-CU-Guard (Olin-Hunt) ammoniacal etchant at pH greater than 9 for 2 minutes at 49° C.

What is claimed is:

1. A polymer comprising a backbone formed of monomers between about 45 and about 65 mole percent of which are selected from the group consisting of styrene, $C_1$–$C_6$-substituted styrene and mixtures thereof and between about 35 and about 55 mole percent of which monomers are selected from the group consisting of maleic anhydride, alkyl-substituted maleic anhydride, aromatic-substituted maleic anhydride and mixtures thereof, monomers of said group ii) providing anhydride groups to the backbone of said polymer, said anhydride groups being mono-esterified to between about 50 and about 65 mole percent with an alkyl, aryl, cycloalkyl, alkylaryl, or arylalkyl first alcohol a) having a molecular weight of at least 100 or mixture of said first alcohols a), and said anhydride groups being mono-esterified to between about 15 and about 50 mole percent of a $C_1$–$C_3$-alkyl second alcohol b) or mixture of said second alcohols b), said polymer being mono-esterified to at least about 80 mole percent total of said anhydride groups, said polymer having a weight average molecular weight of between about 80,000 and about 200,000, and an acid number of between about 170 and about 220.

2. A polymer according to claim 1 wherein said polymer backbone is formed of monomers comprising unsubstituted styrene and unsubstituted maleic anhydride.

3. A polymer according to claim 1 wherein said first alcohol a) is cyclohexyl methonal.

4. A polymer according to claim 1 wherein said first alcohol a) is methylcyclohexanol.

5. A polymer according to claim 1 wherein said first alcohol a) is phenylethyl alcohol.

6. A polymer according to claim 1 wherein said first alcohol a) is 2-ethyl-1-hexanol.

7. A polymer according to claim 1 wherein said first alcohol a) is 3-cyclohexyl-1-propanol.

8. A polymer according to claim 1 wherein said second alcohol b) is methanol.

* * * * *

UNITED STATES PATENT AND TRADEMARK OFFICE
CERTIFICATE OF CORRECTION

PATENT NO.   : 5,773,518
DATED        : June 30, 1998
INVENTOR(S)  : Keil et al.

It is certified that error appears in the above-indentified patent and that said Letters Patent is hereby corrected as shown below:

*Column 6, line 21, "Benzbphenone" should be --Benzophenone--.*

Signed and Sealed this

Twentieth Day of October, 1998

Attest:

BRUCE LEHMAN

Attesting Officer

Commissioner of Patents and Trademarks